United States Patent [19]

Jackson

[11] Patent Number: 4,559,395
[45] Date of Patent: Dec. 17, 1985

[54] FLAME RETARDENT EPOXY RESIN COMPOSITION

[75] Inventor: Roy J. Jackson, Houston, Tex.

[73] Assignee: Shell Oil Company, Houston, Tex.

[21] Appl. No.: 704,691

[22] Filed: Feb. 22, 1985

[51] Int. Cl.$^4$ .................... C08G 59/30; C08G 59/50
[52] U.S. Cl. .................................. 528/102; 528/123
[58] Field of Search .............................. 528/102, 123

[56] References Cited

U.S. PATENT DOCUMENTS

| | | | |
|---|---|---|---|
| 3,058,946 | 10/1962 | Nametz | 528/102 X |
| 3,397,156 | 8/1968 | Lopez et al. | 528/102 X |
| 3,903,048 | 9/1975 | Lombardi et al. | 528/123 X |
| 4,111,909 | 9/1978 | Simons | 528/123 |
| 4,221,893 | 9/1980 | Behar et al. | 528/102 X |

Primary Examiner—Earl Nielsen

[57] ABSTRACT

This invention relates to a flame retardant cured epoxy composition useful for electrical laminates comprising a brominated epoxy resin, aromatic amine and dicyandiamide.

3 Claims, No Drawings

FLAME RETARDENT EPOXY RESIN COMPOSITION

FIELD OF THE INVENTION

The present invention relates to a flame retardant cured epoxy composition comprising a brominated epoxy resin, aromatic amine and dicyandiamide.

BACKGROUND OF THE INVENTION

Glass-base laminates prepared from glass fabric impregnated with an epoxy resin are used in the manufacture of printed circuit boards. The laminate should exhibit, as a general rule, good mechanical, electrical and chemical properties as well as flame retardancy. Nonetheless, these laminates must keep pace with advances in technologies utilizing them which, in turn, lends to more stringent property requirements.

Epoxy glass laminates, having a copper clad on one or both faces, are subject to severe cleaning and etching processes. The laminate, therefore, must possess superior chemical and solvent resistance. Equally important is the peel strength which is the measure of bond strength between the metal foil and laminate. This bond should be sufficiently strong not only as measured at room temperature and for hot peel at 125° C., but also after the solder float test with solder at 500° F. and after continuous service at high temperatures of about 100° C.

In the manufacture of printed circut boards, the laminate is subjected to molten solder by solder floating or solder waving in order to connect the electrical components to the board. If the laminate is defective, it may show numerous cracks on the surface, and in extreme cases blisters may form. This defect is known as "measling", which generally is caused by relatively low heat-resistance or high moisture absorption of the laminates. These adverse properties are affected by the quality of the laminating epoxy resins and, to some extent, by the manufacturing processes.

When electrical components are to be connected to the printed circuit board, a plurality of holes are drilled in the laminate, which may be plated or soldered to provide electrical connections. Holes drilled with high speed carbide tipped drills must be smooth and clean and have good dimensional tolerance so that electronic components can be inserted into the holes and firmly soldered in place. If the epoxy resin composition sets to a very high crosslink density, forming a tight and dense crosslink lattice, the resin may cause rapid wearing of the drills. On the other hand, improperly balanced epoxy resin compositions that have a low heat distortion temperature would give a "soft" laminate, and the heat generated during drilling softens the drill dust which smears the holes or sticks to the drill. In severe cases, the excessive heat generated by drilling might degrade the surrounding resin to show a defect known as "halo" and separation of the metal foil from the laminate around the holes might occur.

Efforts have been made to overcome the aforementioned problems or defects by modifying the epoxy resin formulation or curing system, or by varying the manufacturing operations. While some properties have been improved to the expected levels, it is often discovered that such improvements are at the expense of other properties. For example, epoxy resin having a high functionality, such as an epoxy novolac or tetrakis(hydroxyphenyl)ethane tetraglycidyl ether, may be blended into the diglycidyl ether of bisphenol-A type epoxy resin to improve the elevated temperature performance and high distortion temperature and to reduce the drill smear of the laminate, but the resin results in laminates exhibiting high rigidity, higher drill wear, and possibly low metal peel strength and discoloration. Post curing of laminates made from conventional epoxy resin often improves their properties; it also may cause warpage and surface non-uniformity. Similarly, modifying the curing system may adversely affect metal foil adhesion, color of the laminates, electrical properties, mechanical properties and hardness.

Certain compositions intended to give improved electrical laminates are disclosed in U.S. Pat. Nos. 3,523,037; 4,075,260; 4,311,753 and 4,327,143. For example, the '260 patent discloses blends of two epoxy resins, about 2.5–5 parts by weight of dicyandiamide and a tertiary amine as a catalyst. The tertiary amine is used in 0.3 to 0.8 parts by weight per 100 parts by weight resin solids.

This invention has therefore as its object to provide improved epoxy resin compositions suitable for impregnating glass fabrics for use in the manufacture of laminates, including metal clad laminates, which exhibit superior electrical, physical and chemical properties.

SUMMARY OF THE INVENTION

The present invention comprises a superior epoxy resin composition for electrical laminates, said composition possessing good flow, meeting typical FR-4 electrical standards and also having a high Tg value. Further, these compositions also possess excellent smear removal properties. In particular, the present invention is an epoxy resin composition useful for preparing flame retardant laminates, said composition comprising:

(a) a brominated epoxy resin comprising the reaction product of tetrabromobisphenol A and epichlorohydrin having an epoxide equivalent weight of about 330 to about 1500 and a bromine content of about 10 to about 50 percent by weight;

(b) an effective amount of an aromatic amine curing agent; and (c) about 2.5 to about 10 parts by weight of dicyandiamide as a curing agent per 100 parts by weight of said brominated epoxy resin.

As shown in the examples which follow, a much preferred aromatic amine is 2,4-bis(p-aminobenzyl)aniline (termed BABA).

DETAILED DESCRIPTION OF THE INVENTION

There are three essential components of the present invention—a brominated epoxy resin, dicyandiamide and an aromatic amine.

The brominated epoxy resin component is a polyglycidyl ether of (1) tetrabromobisphenol A or (2) a mixture of tetrabromobisphenol A and bisphenol A or (3) a mixture of tetrabromobisphenol A and a polyhydroxy aromatic compound or (4) a mixture of tetrabromobisphenol A, a polyhydroxy aromatic compound and bisphenol A. It has a functionality of about 2 to 8, a bromine content of about 10 to about 50 percent by weight, preferably 18 to 22 percent by weight, and an epoxide equivalent weight of about 330 to about 1500, preferably about 330 to about 575.

Dicyandiamide (cyanoguanidine or "DICY") is the preferred curing agent in this epoxy resin system of the invention. The amount of DICY employed is about 2.5 to about 10 parts by weight per 100 parts by weight of said brominated epoxy resin, preferably about 2.5 to about 5.5 parts by weight.

An aromatic amine is employed as a co-curing agent. Suitable aromatic amines include, among others, methylenedianiline, metaphenylenediamine, 2,4-bis[p-aminobenzyl]aniline, diaminodiphenyl sulfone, 2,4-toluenediamine, 1,3-diamino-2,4-diethyl-6-methylbenzene, 4,4'-oxydianiline, methylenebis(ortho-chloroaniline), 2,6-diaminopyridine, 4-bromo-1,3-diaminobenzene, etc. The preferred aromatic amine is 2,4-bis(p-aminobenzyl)aniline, better known as BABA.

An effective amount of aromatic amine curing agent is employed. Operable amounts range from about 0.1 to about 1.0 chemical equivalents of amine to epoxy resin, with from about 0.2 to 0.6 being preferred. As used herein, a chemical equivalent amount is the amount to furnish one amino hydrogen per epoxy group.

The epoxy resin system of the present invention are used in preparing laminating compositions according to standard procedures.

The following examples are given to illustrate the preparation of the instant heat-curable thermosetting compositions. It is understood that the examples are embodiments only and are given for the purpose of illustration and the invention is not to be regarded as limited to any specific components and/or specific conditions recited therein. Unless otherwise indicated, parts and percentages in the examples, are parts and percentages by weight.

EXAMPLE 1

Dicyandiamide (DICY) is the preferred curing agency for epoxy resins in the production of electrical laminates. It provides latency at room temperature and good reactivity in combination with accelerators (typically benzyldimethylamine or 2-methyl imidazole) at 300°-400° F. One drawback to DICY in these applications is its limited solubility in the resin/solvent blends (varnish). In order to avoid DICY solubility problems (DICY crystals dropout) during the prepreg process, laminators will use DICY at a level considerably below its stoiciometry. Applicant has found that in order to obtain the highest properties (highest Tg) one would like to be able to use DICY at or near its stoichiometric value. A system which allows one to cure epoxy resins in electrical applications at or near stoichiometry in curing agents, without solubility problems, would be highly desirable. Applicant has developed a system, which in laboratory tests appears to satisfy this requirement. This system consists of DICY in combination with a highly functional aromatic amine. The results of laboratory studies performed on this "hybrid" curing system are discussed in this example.

In the initial screening of aromatic amines, a number of systems were considered (Table 1). As can be seen from the Table, BABA[1] in combination with DICY gave the highest glass transition (Tg). m-Phenylene diamine (MPDA), as one would expect based upon its structure forms a tightly crosslinked network, in combination with DICY had the second highest Tg. Since BABA gave the highest Tg, this system was chosen for additional development.

[1]BABA=2,4 bis(p-Amino benzyl) aniline or

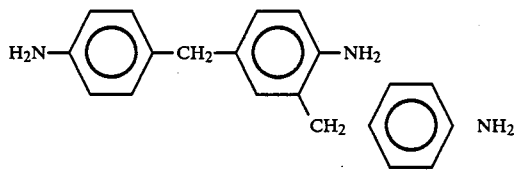

The cure of epoxy resins based on BABA occurs at a higher temperature than that of accelerated DICY. Prepregs and laminates were made from an EPON ® Resin 1123 formulation, which in addition to 2.9 phr DICY, had 3.75 phr of BABA. High quality prepregs and laminates were easily made from the formulation without any apparent change due to the presence of BABA. The laminate had good flow, was found to meet typical FR-4 electrical standards but had a higher Tg (Tg 152° C. vs 137°-140° C. for EPON 1123 cured with DICY alone). Laboratory tests show that it may have an advantage over similar high performance systems based upon multifunctional resins in smear removal[2]. The hybrid system is more reactive than straight EPON Resin 1123 which could potentially translate to increased production rate. Faster reacting resins which may shorten press cycles would be highly desirable.

[2]Resin smear accumulates during the hole drilling process in multilayer printed circuit board manufacture. Failure to remove the smear will result in a dielectric barrier between the conduction path of applied copper plate and copper conductive layer. Removing smear from high performance systems containing multifunctional resins in particular is extremely difficult. Desmearing of these systems often require more time and/or more special desmearing solutions which adds to the processing cost.

BABA is used in the presence of multifunctional resins. The advantages of BABA used this way appear to be twofold:

(1) It reduces the amount of multifunctional resins required to raise the Tg to comparable levels (reducing cost since multifunctional resins are very expensive). See Table 2, systems 1, 2 and 4.

(2) Although the Tg has been raised significantly by the addition of BABA to the multifunctional resins, the system may desmear very much like a system based solely on a diffunctional resin (EPON 1123-like resin).

In summary, the combination of BABA and DICY, affords a unique avenue to high performance systems for multilayer printed circuit board applications. When used in presence of multifunctional resins it reduces the amount of multifunctional resin required to obtain a similar Tg in the absence of BABA. The high Tg systems incorporating multifunctional resins and BABA may have advantages over systems not including BABA in smear removal, thus reducing the processing difficulties and cost (see Table 2).

TABLE 1

EXAMINATION OF THE EFFECT OF AROMATIC AMINE IN COMBINATION WITH DICY[1] ON THE GLASS TRANSITIONS (Tg) OF EPOXY RESINS FOR ELECTRICAL APPLICATIONS

| Run No. | Aromatic Amine[2] | % Stoich[3] | Tg[4] |
|---|---|---|---|
| 16117-9 | MPDA | 20 | 135 |
| 16117-12 | MPDA | 30 | 137 |
| 16117-13 | BABA | 20 | 128 |
| 16117-14 | BABA | 30 | 140 |
| 16117-44-3 | DADS | 20 | 123 |
| 16117-44-4 | DADS | 30 | 134 |
| 16117-44-5 | MDA | 20 | 127 |
| 16117-44-6 | MDA | 30 | 128 |
| 16117-Control[6] | — | — | 125 |

TABLE 1-continued

EXAMINATION OF THE EFFECT OF AROMATIC AMINE IN COMBINATION WITH DICY[1] ON THE GLASS TRANSITIONS (Tg) OF EPOXY RESINS FOR ELECTRICAL APPLICATIONS

| Run No. | Aromatic Amine[2] | % Stoich[3] | Tg[4] |
| --- | --- | --- | --- |
| 16117-156 | BABA | 30 | 152[5] |

[1]In all runs DICY used at 2.9 phr (58% stoichiometry based upon 1123 WPE of 425 and functionality of 4 for DICY).
[2]MPDA = m-phenylene diamine, BABA - bis amino benzyl aniline, DADS = diamino diphenyl sulphone, MDA = Methylene dianiline.
[3]Stoichiometry based upon amine. Total stoichiometry obtained by adding DICY (58%).
[4]Samples were cured in an oven for 2 hours at 160° C. Samples were then placed in the DSC and heated at 40° C./minute from 50° C.–200° C. with a 20 minute hold at 200° C. (Tg recorded).
The ultimate (reported) Tg was obtained by repeating the scan-hold cycle until the Tg no longer increased.
[5]Ultimate Tg taken on a laminate (prepregging was performed for 3 minutes at 163° C.).
[6]Regular Epon Resin 1123 with 2.9 phr dicy and no aromatic amine, treated as in Examples '9-44.

TABLE 2

AN EXAMINATION OF THE EFFECT OF Tg ON ETCH REMOVAL ON MODERATELY HIGH Tg SYSTEMS

| Resin Systems | Tg | % Etch Removal |
| --- | --- | --- |
| (1) EPON ® Resin 1123/ DPS 164 70/30 | 153 | 0.41 |
| (2) EPON Resin 1123/ EPON Resin 1031 70/30 | 155 | 0.26 |
| (3) EPON Resin 1123/ BABA 100/3.75 | 152 | 2.3 |
| (4) EPON Resin 1123/ DPS 164/BABA 100/14/4.2 | 157 | 2.46 |
| (5) Control EPON Resin 1123 | 138 | 2.56 |

Note:
(a) EPON Resin 1123 is brominate epoxy resin according to the present invention having a weight per epoxide (WPE) of about 425 and a bromine content of about 20 percent.
(b) EPON Resin 1031 is the tetraglycidyl ether of tetraphenol ethane.
(c) DPS 164 is an orthocresylic novolak glycidyl ether.

What is claimed is:

1. An epoxy resin composition useful for preparing flame retardant laminates, said composition comprising:
   (a) a brominated epoxy resin comprising the reaction product of tetrabromobisphenol-A and epichlorohydrin having an epoxide equivalent weight of about 350 to about 1500 and a bromine content of about 10 to about 50 percent by weight;
   (b) an effective amount of an aromatic amine curing agent; and
   (c) about 2.5 to about 10 parts by weight of dicyandiamide as a curing agent per 100 parts by weight of said brominated epoxy resin.

2. The composition of claim 1 wherein said aromatic amine is selected from the group consisting of methylenedianiline, metaphenylenediamine, 2,4-bis[p-aminobenzyl]aniline, diaminodiphenyl sulfone, 2,4-toluenediamine, 1,3-diamino-2,4-diethyl-6-methylbenzene, 4,4'-oxydianiline, methylenebis(ortho-chloroaniline), 2,6-diaminopyridine, 4-bromo-1,3-diaminobenzene, etc.

3. The composition of claim 2 wherein said aromatic amine is 2,4-bis(p-aminobenzyl)aniline.

* * * * *